(12) United States Patent
Kodama et al.

(10) Patent No.: US 8,174,907 B2
(45) Date of Patent: May 8, 2012

(54) SEMICONDUCTOR DEVICE HAVING DATA INPUT/OUTPUT UNIT CONNECTED TO BUS LINE

(75) Inventors: Takuyo Kodama, Tokyo (JP); Yoji Idei, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 204 days.

(21) Appl. No.: 12/763,741

(22) Filed: Apr. 20, 2010

(65) Prior Publication Data

US 2010/0284228 A1 Nov. 11, 2010

(30) Foreign Application Priority Data

May 7, 2009 (JP) .................................. 2009-112879

(51) Int. Cl.
*G11C 7/10* (2006.01)

(52) U.S. Cl. ..................... 365/189.05; 365/194; 365/205

(58) Field of Classification Search ............. 365/189.05, 365/194, 205
See application file for complete search history.

(56) References Cited

U.S. PATENT DOCUMENTS 5,226,012 A * 7/1993 Amano et al. ........... 365/189.05

FOREIGN PATENT DOCUMENTS

JP 08-139287 5/1996

* cited by examiner

*Primary Examiner* — Son Dinh
*Assistant Examiner* — Nam Nguyen
(74) *Attorney, Agent, or Firm* — McDermott Will & Emery LLP

(57) ABSTRACT

To provide a semiconductor device including: first and second bus lines; a first buffer connected between the first and second bus lines; second and third buffers connected to the first bus line; fourth and fifth buffers connected to the second bus line; first to fourth banks connected via the first, second, and third buffers to the second bus line; fifth to eighth banks connected via the fourth and fifth buffers to the second bus line; and a data input/output unit connected to the second bus line. Transfer delay times of the fourth and fifth buffers are longer than transfer delay times of the first, second, and third buffers. Thereby, it becomes possible to eliminate differences in data transfer times resulting from differences in distances between far and near ends without causing significant increase in wire density, increase in power consumption, or the like.

14 Claims, 7 Drawing Sheets

SBL0,SBL1

BL0

BL1

SBL2,SBL3

NODE A

TA

BL1

ΔT

SEMICONDUCTOR DEVICE HAVING DATA INPUT/OUTPUT UNIT CONNECTED TO BUS LINE

BACKGROUND OF THE INVENTION

1. Field of the Invention

The present invention relates to a semiconductor device, and more particularly relates to a semiconductor device having a layout in which wire distances between a data input/output unit and a plurality of internal circuits are nonuniform.

2. Description of Related Art

A semiconductor memory device such as a DRAM (Dynamic Random Access Memory) employs external terminals including a data input/output terminal, an address terminal, a command terminal, and the like. Among these external terminals, the data input/output terminal provides high-speed data transfer with a plurality of banks, and thus it is desired that wire distances between a data input/output unit connected to the data input/output terminal and each of the banks are uniform.

However, as shown in FIG. 7A, distances between each of banks 1 to 4 and a data input/output unit 5 are nonuniform in some layouts. In such cases, data transfer times vary among the banks due to the differences in distances between far and near ends (see Japanese Patent Application Laid-open No. H8-139287). When the data transfer times vary among the banks, a period during which data is available is reduced. This necessitates elimination of the differences in data transfer times resulting from the differences in distances between far and near ends.

FIGS. 7B and 7C are schematic diagrams of configurations of a conventional semiconductor memory device in which the differences in data transfer times are eliminated.

In the semiconductor memory device shown in FIG. 7B, by making a detour of a bus line, wire lengths between each of the banks 1 to 4 and the data input/output unit 5 are uniformized. More specifically, data read from the banks 1 and 2 are supplied via a buffer 11 to a bus line 21 and further supplied via a buffer 13 to a bus line 23. On the other hand, data read from the banks 3 and 4 are supplied via a buffer 12 to a bus line 22 and further supplied via the buffer 13 to the bus line 23. As shown in FIG. 7B, the bus line 23 is connected to the data input/output unit 5 and commonly provided to each of the banks 1 to 4. Thereby, the wire distances between each of the banks 1 to 4 and the data input/output unit 5 are made uniform, and thus the differences in data transfer times resulting from the differences between far and near ends are eliminated.

However, in the semiconductor memory device shown in FIG. 7B, the bus line is merely detoured, and thus there is a problem in that a wire density is increased. Specifically, because there are the bus lines 22 and 23 side by side in an area near the data input/output unit 5, the wire density in this area is doubled. For example, when the number of input/output bits is 16 and a burst length is four bits, data transfer using the bus lines 21 to 23 is performed in units of 64 (=16×4) bits, and thus each of the bus lines 21 to 23 is configured by 64 wires. In this case, it is necessary to form 128 wires in the area near the data input/output unit 5, and accordingly, there arises a problem that the wire density in this area significantly increases.

In the semiconductor memory device shown in FIG. 7C, wire loads in the banks 1 to 4 are made uniform by short-circuiting a bus line. Thereby, the differences in data transfer times resulting from the differences between far and near ends are eliminated. More specifically, the buffers 11 and 12 are short-circuited by using a same bus line 24, and thereby, the wire loads in the banks 1 to 4 are made uniform.

However, in the semiconductor memory device shown in FIG. 7C, the wire loads of the bus line 24 become very large, which adversely increases the data transfer times. To solve this problem, it is necessary to lower a resistance by increasing a wire width of the bus line 24. In this case, however, not only an area occupied by the bus line 24 is increased but also a parasitic capacitance of the bus line 24 is increased. Therefore, power consumption increases.

As described above, although it is possible to eliminate the differences in data transfer times, the conventional semiconductor memory devices have the problems such as significant increase in the wire density and increase in the power consumption. The problems can occur not only in the semiconductor memory device but also in all the semiconductor devices having layouts in which wire distances between a data input/output unit and a plurality of internal circuits are nonuniform.

SUMMARY

In one embodiment, there is provided a semiconductor device comprising: first and second bus lines; a first buffer connected between the first and second bus lines; a second buffer connected to the first bus line on an opposite side from the first buffer; a third buffer connected to the second bus line on an opposite side from the first buffer; a first internal circuit connected via the second buffer to the first bus line; a second internal circuit connected via the third buffer and the first buffer to the first bus line; and a data input/output unit connected to the first bus line, wherein a transfer delay time of the second buffer is longer than each of transfer delay times of the first and third buffers.

According to the present invention, a transfer delay time of a buffer assigned to an internal circuit near the data input/output unit is longer than a transfer delay time of a buffer assigned to an internal circuit far from a data input/output unit. Therefore, it is possible to eliminate a difference in data transfer times resulting from a difference in distances between far and near ends without causing significant increase in wire density, increase in power consumption, or the like.

BRIEF DESCRIPTION OF THE DRAWINGS

The above features and advantages of the present invention will be more apparent from the following description of certain preferred embodiments taken in conjunction with the accompanying drawings, in which:

FIG. 5A is a waveform chart obtained when the read data is read from the banks Bank0 to Bank3, and FIG. 5B is a waveform chart obtained when the read data is read from the banks Bank4 to Bank7;

FIG. 7A is a schematic plan view of a semiconductor device having a layout in which distances between each of banks and a data input/output unit are nonuniform, FIG. 7B is an example in which wire lengths between each of banks and a data input/output unit are made uniform by detouring a bus line, and FIG. 7C is an example in which wire loads in banks are made uniform by short-circuiting a bus line.

DETAILED DESCRIPTION OF THE EMBODIMENTS

Preferred embodiments of the present invention will be explained below in detail with reference to the accompanying drawings.

Figure 1:
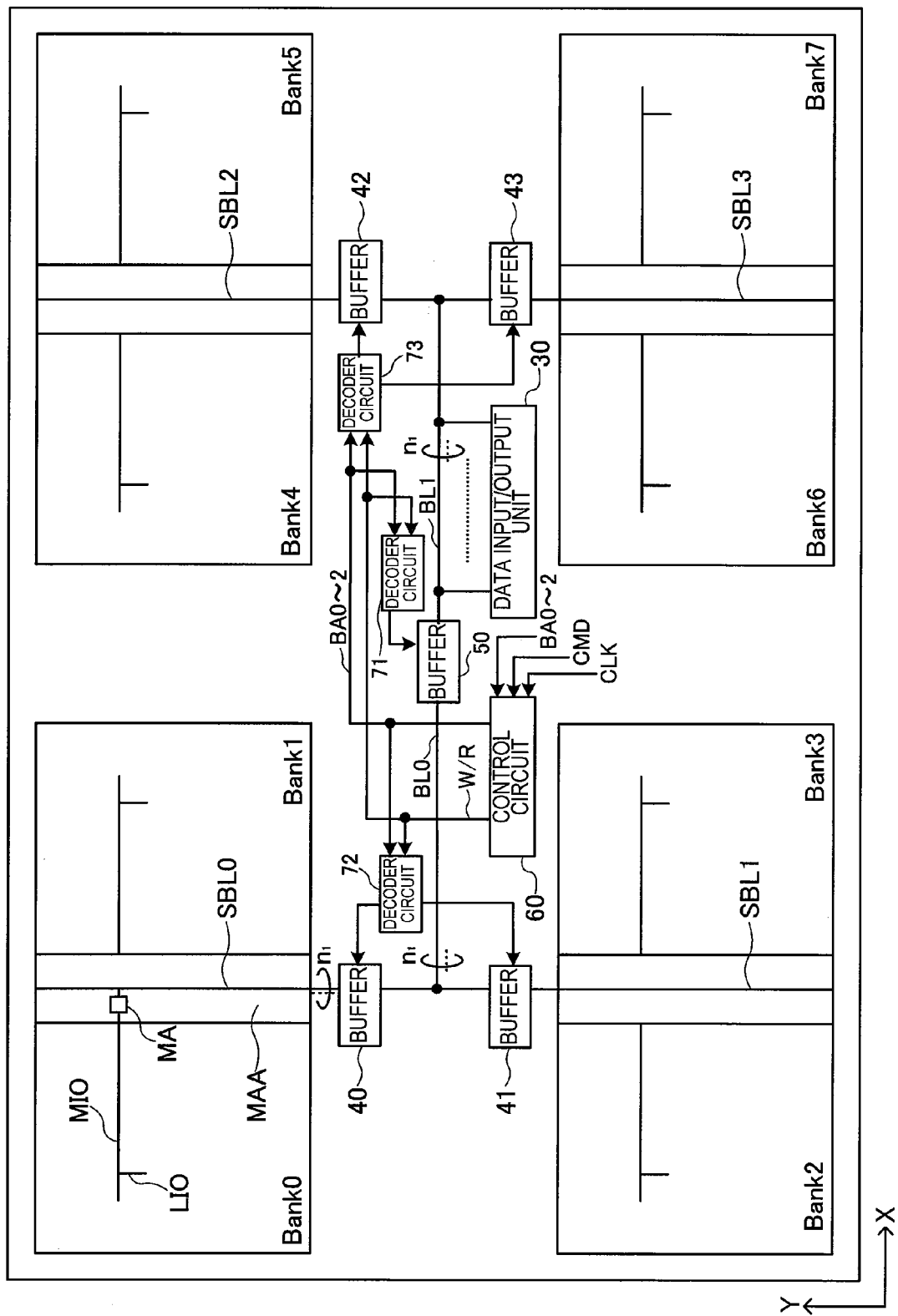
FIG. 1 is a schematic plan view of a configuration of a semiconductor device according to an embodiment of the present invention.

FIG. 1 is a schematic plan view of a configuration of a semiconductor device according to an embodiment of the present invention.

The semiconductor device according to the embodiment is a DRAM and has eight banks Bank0 to Bank7, as shown in FIG. 1. The banks Bank0 to Bank7 are arrayed in such a manner that there are four banks in an X direction and two in a Y direction. More specifically, the banks Bank0, Bank1, Bank4, and Bank5 are arrayed in a line in the X direction, and the banks Bank2, Bank3, Bank6, and Bank7 are also arrayed in a line in the X direction. Two banks, that is, Bank0 and Bank1, Bank2 and Bank3, Bank4 and Bank5, and Bank6 and Bank7 share a same main amplifier area MAA, respectively. Each main amplifier area MAA is located in an area sandwiched by the two corresponding banks and has a shape longer in the Y direction.

In the main amplifier areas MAA, sub-bus lines SBL0 to SBL3 extending in the Y direction are arranged, respectively. Wire lengths of the sub-bus lines SBL0 to SBL3 are equal. Each of the sub-bus lines SBL0 to SBL3 is connected via a main amplifier MA to any one of main I/O lines MIO. The main I/O line MIO is connected to any one of local I/O lines LIO. The local I/O line LIO is connected via a sense amplifier to any one of bit lines. The sense amplifiers and the bit lines are not shown in FIG. 1.

As shown in FIG. 1, in the semiconductor device according to the present embodiment, a data input/output unit 30 is laid out not in a center of a chip but at a position offset in the X direction (the right direction in FIG. 1) from the center of the chip. More specifically, the data input/output unit 30 is laid out at a position relatively far from the banks Bank0 to Bank3 laid out in the left direction of FIG. 1 and relatively near the banks Bank4 to Bank7 laid out in the right direction of FIG. 1. The data input/output unit 30 is connected to a data input/output terminal and sometimes called a FIFO circuit in a case of a DDR synchronous DRAM.

Connection relation between each of the sub-bus lines SBL0 to SBL3 and the data input/output unit 30 will be explained. One ends of the sub-bus lines SBL0 to SBL3 are connected to buffers 40 to 43, respectively. Of these buffers, the buffer 40 is a circuit that connects the sub-bus line SBL0 and a bus line BL0, the buffer 41 is a circuit that connects the sub-bus line SBL1 and the bus line BL0, the buffer 42 is a circuit that connects the sub-bus line SBL2 and a bus line BL1, and the buffer 43 is a circuit that connects the sub-bus line SBL3 and the bus line BL1.

The bus lines BL0 and BL1 are both arranged in the X direction, and the both lines are connected via a buffer 50. In other words, the bus line BL0 is located on a side of the banks Bank0 to Bank3, one end of the line is connected to the buffers 40 and 41, and the other end is connected to the buffer 50. The bus line BL1 is located on a side of the banks Bank4 to Bank7, one end of the line is connected to the buffers 42 and 43, and the other end is connected to the buffer 50. Wire lengths of the bus lines BL0 and BL1 are equal. Accordingly, the buffer 50 is located between an area where the banks Bank0 to Bank3 are formed and an area where the banks Bank4 to Bank7 are formed.

As shown in FIG. 1, the data input/output unit 30 is connected to the bus line BL1. Accordingly, wire lengths from the data input/output unit 30 to the banks Bank0 to Bank3 are relatively long, and those from the data input/output unit 30 to the banks Bank4 to Bank7 are relatively short. A specific difference in wire lengths is defined by a wire length of the bus line BL0.

The number n1 of the bus lines and the sub-bus lines is determined by a product of the number n2 of input/output bits and a burst length n3(=n2×n3). For example, when the number n2 of input/output bits is 16 and the burst length n3 is four bits, data transfer using the bus lines and the sub-bus lines is performed in units of 64 (=16×4) bits, and thus each of the bus lines and the sub-bus lines is configured by 64 wires.

The semiconductor device according to the present embodiment further includes a control circuit 60. The control circuit 60 controls decoder circuits 71 to 73 in response to bank addresses BA0 to BA2, a command CMD, and a clock signal CLK, which are supplied from outside.

The decoder circuit 71 receives a control signal W/R and a highest-order bit BA2 of a bank address, and based thereon, controls the buffer 50. The decoder circuit 72 receives the control signal W/R and the bank addresses BA0 to BA2, and based thereon, controls the buffers 40 and 41. The decoder circuit 73 receives the control signal W/R and the bank addresses BA0 to BA2, and based thereon, controls the buffers 42 and 43.

More specifically, when the highest-order bit BA2 of the bank address indicates the banks Bank0 to Bank3 on the left side, the decoder circuit 71 permits a read operation or a write operation of the buffer 50 based on the control signal W/R. On the other hand, when the highest-order bit BA2 of the bank address indicates the banks Bank4 to Bank7 on the right side, the decoder circuit 71 changes the buffer 50 to a high-impedance state irrespective of the control signal W/R.

When the bank address indicates the banks Bank0 and Bank1, the decoder circuit 72 activates the buffer 40 and permits a read operation or a write operation of the buffer 40 based on the control signal W/R. On the other hand, when the bank address indicates the banks Bank2 and Bank3, the decoder circuit 72 activates the buffer 41 and permits a read operation or a write operation of the buffer 41 based on the control signal W/R.

Similarly, when the bank address indicates the banks Bank4 and Bank5, the decoder circuit 73 activates the buffer 42 and permits a read operation or a write operation of the buffer 42 based on the control signal W/R. On the other hand, when the bank address indicates the banks Bank6 and Bank7, the decoder circuit 73 activates the buffer 43 and permits a read operation or a write operation of the buffer 43 based on the control signal W/R.

Figure 2:
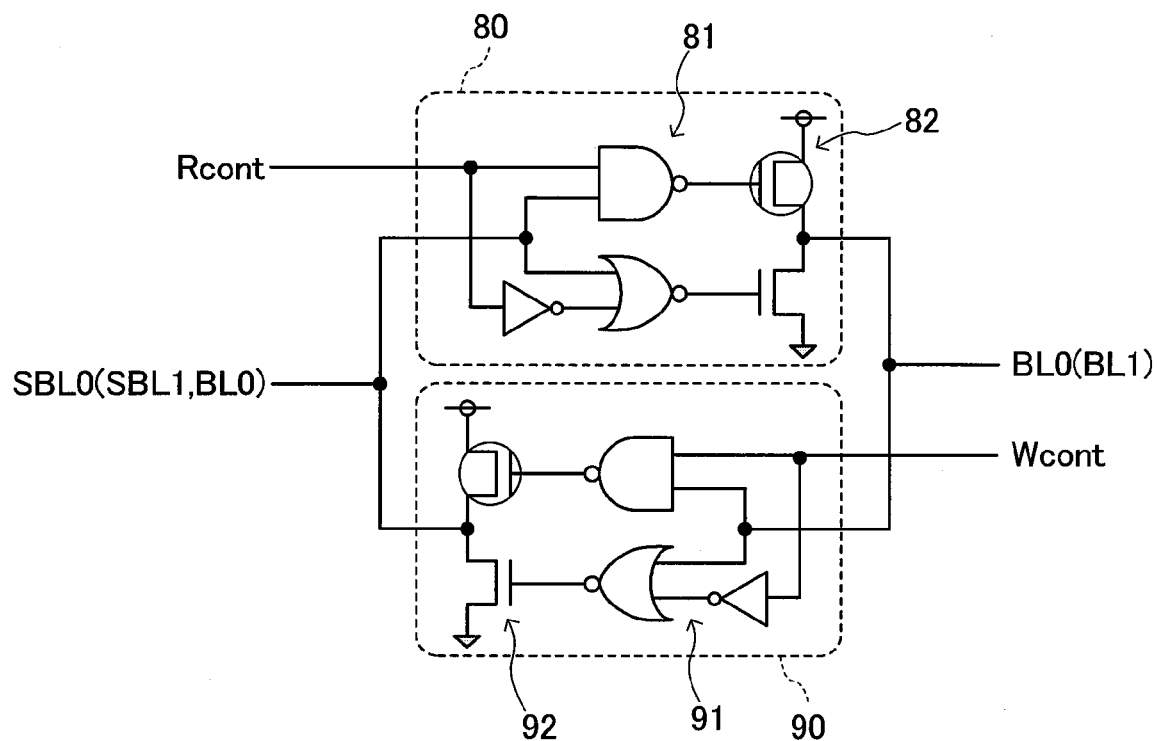
FIG. 2 is a circuit diagram of the buffer 40.

FIG. 2 is a circuit diagram of the buffer 40.

As shown in FIG. 2, the buffer 40 is a bidirectional buffer and includes a read tristate buffer 80 and a write tristate buffer 90. The read tristate buffer 80 includes a logic circuit 81 that receives read data supplied via the sub-bus line SBL0 and a read control signal Rcont supplied from the decoder circuit 72, and an output transistor 82 that drives the bus line BL0 based on output of the logic circuit 81. With this configuration, when the read control signal Rcont is at a high level, the read tristate buffer 80 buffers the read data supplied via the sub-bus line SBL0 and transfers the data to the bus line BL0. On the other hand, when the read control signal Rcont is at a low level, the read tristate buffer 80 becomes a high-impedance state.

Similarly, the write tristate buffer 90 includes a logic circuit 91 that receives write data supplied via the bus line BL0 and a write control signal Wcont supplied from the decoder circuit 72, and an output transistor 92 that drives the sub-bus line SBL0 based on output of the logic circuit 91. With this configuration, when the write control signal Wcont is at a high level, the write tristate buffer 90 buffers the write data supplied via the bus line BL0 and transfers the data to the sub-bus line SBL0. On the other hand, when the write control signal Wcont is at a low level, the write tristate buffer 90 becomes a high-impedance state.

The buffer 41 has the same circuit configuration as that of the buffer 40 shown in FIG. 2 except that an input side of the read tristate buffer 80 (an output side of the write tristate buffer 90) is connected to the sub-bus line SBL1.

The buffer 50 also has the same circuit configuration as that of the buffer 40 shown in FIG. 2 except that the input side of the read tristate buffer 80 (the output side of the write tristate buffer 90) is connected to the bus line BL0 and an output side of the read tristate buffer 80 (an input side of the write tristate buffer 90) is connected to the bus line BL1. The read control signal Rcont and the write control signal Wcont are supplied to the buffer 50 from the decoder circuit 71.

Data transfer by using the buffers 40, 41, and 50 requires a predetermined transfer delay time T0. However, in the buffers 40, 41, and 50, components such as a delay circuit that increases a data transfer time are not provided, and thus the transfer delay time T0 is relatively short. In this case, when T0$a$ indicates a transfer delay time of the buffers 40 and 41 and T0$b$ indicates a transfer delay time of the buffer 50, a relationship between times T0$a$ and T0$b$ is not particularly limited.

Figure 3:
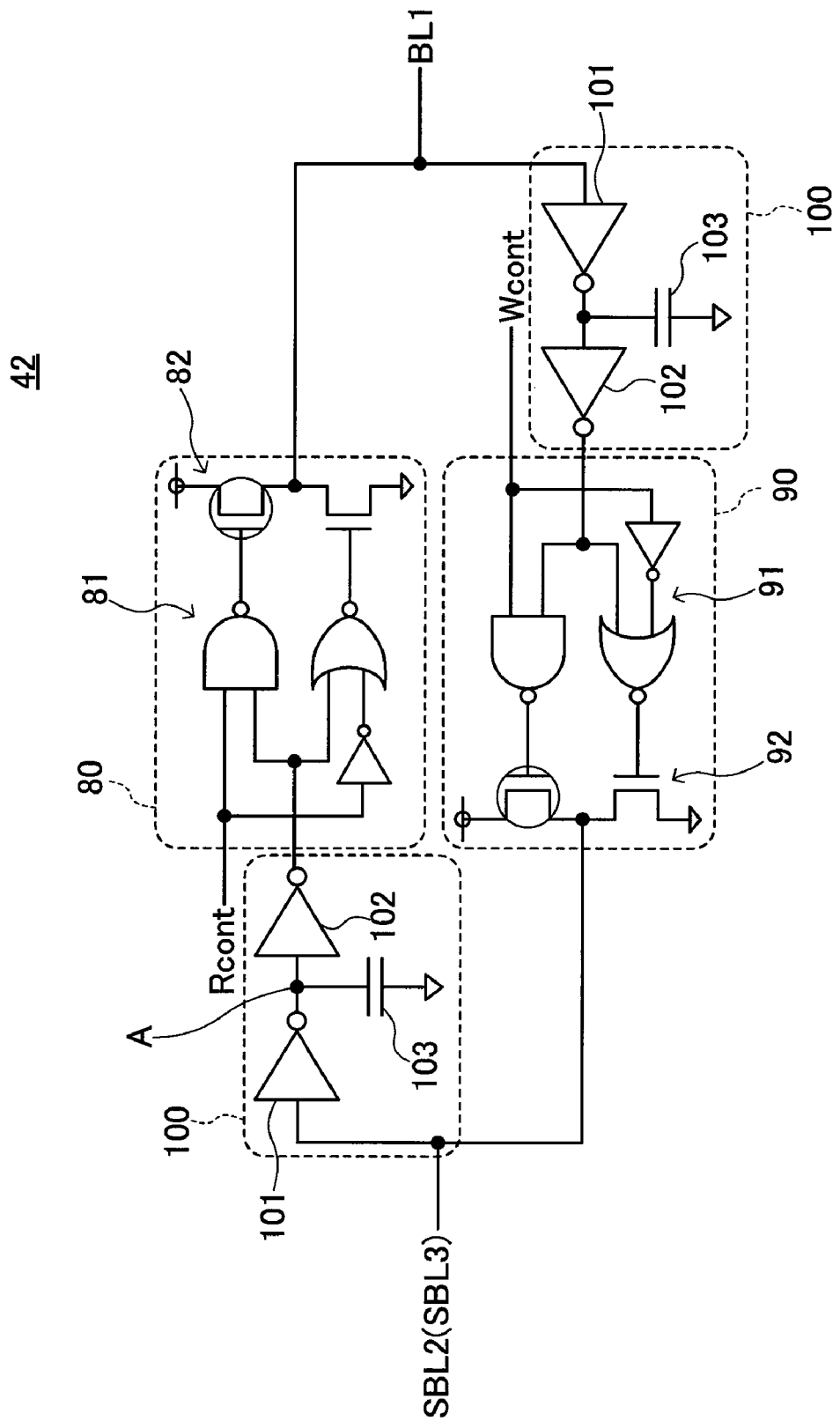
FIG. 3 is a circuit diagram of the buffer 42.

FIG. 3 is a circuit diagram of the buffer 42.

As shown in FIG. 3, the buffer 42 is also a bidirectional buffer and has the same circuit configuration as that of the buffer 40 shown in FIG. 2 except that delay circuits 100 that increase the data transfer time are added. Specifically, the buffer 42 includes the read tristate buffer 80 having an input side connected to the sub-bus line SBL2 and an output side connected to the bus line BL1, and the write tristate buffer 90 having an input side connected to the bus line BL1 and an output side connected to the sub-bus line SBL2. The buffer 42 further includes the delay circuits 100 connected at a preceding stage of the tristate buffers 80 and 90, respectively. The read control signals Rcont and the write control signal Wcont are supplied to the buffer 42 from the decoder circuit 73.

The delay circuit 100 includes two stages of inverters 101 and 102 that are connected in cascade, and a capacitive element 103 having one end connected to an output end of the inverter 101 (an input end of the inverter 102). With this configuration, the read data supplied via the sub-bus line SBL2 is delayed by the delay circuit 100 and supplied to the tristate buffer 80. The write data supplied via the bus line BL1 is delayed by the delay circuit 100 and supplied to the tristate buffer 90. A delay amount can be adjusted by using a capacitance of the capacitive element 103, or the like.

The buffer 43 has the same circuit configuration as that of the buffer 42 shown in FIG. 3 except that the input side of the read tristate buffer 80 (an output side of the write tristate buffer 90) is connected to the sub-bus line SBL3.

Data transfer by using the buffers 42 and 43 requires a predetermined transfer delay time T1. As described above, the buffers 42 and 43 include the delay circuits 100 used for increasing the data transfer time, and thus the transfer delay time T1 is relatively long. Therefore, a relationship of T1>T0 is established. More preferably, as described above, the delay amount of the delay circuit 100 is designed such that T1=T0$a$+T0$b$ is established where T0$a$ indicates the transfer delay time of the buffers 40 and 41 and T0$b$ indicates the transfer delay time of the buffer 50.

Figure 4:
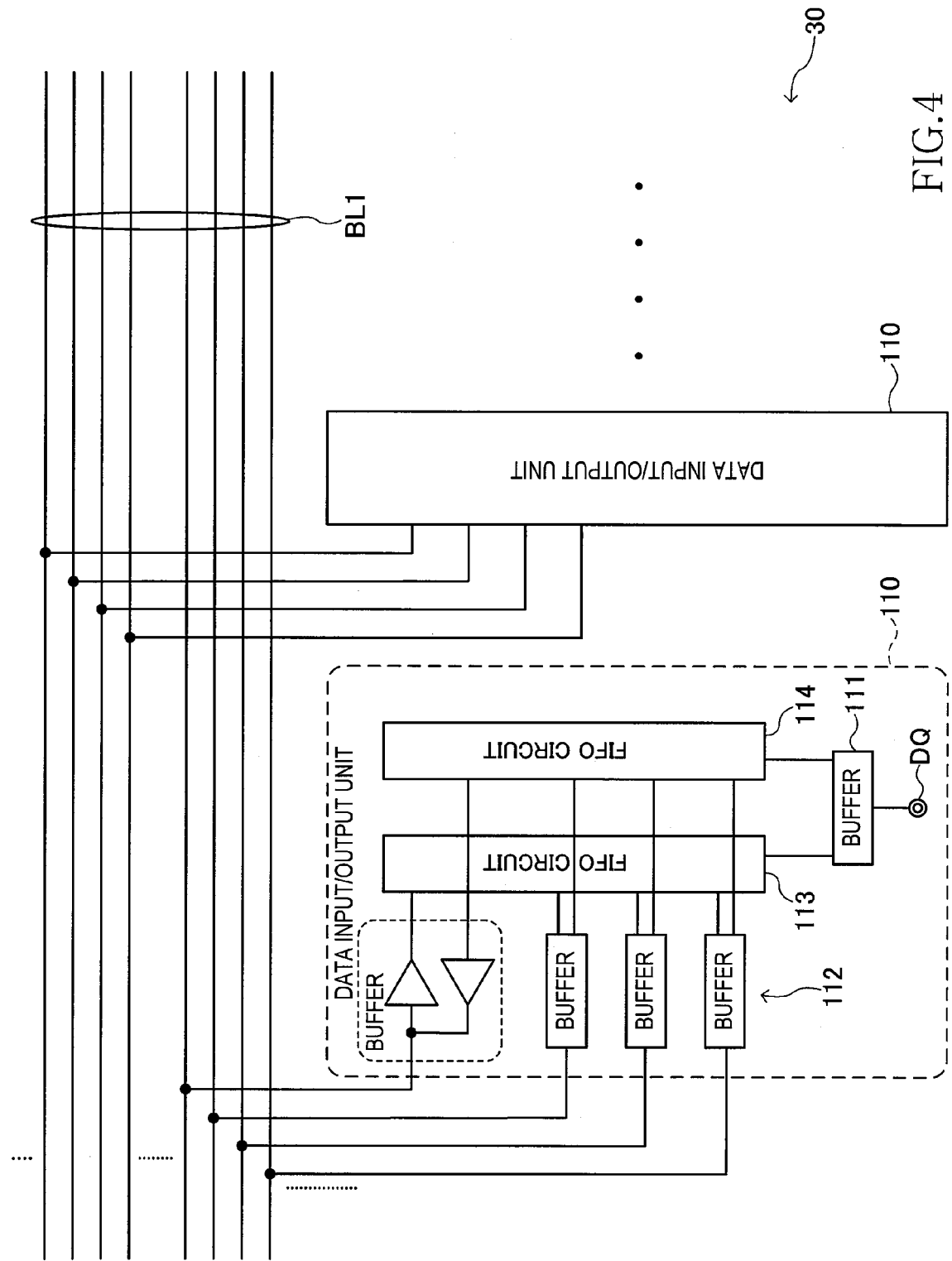
FIG. 4 is a circuit diagram of the data input/output unit 30.

FIG. 4 is a circuit diagram of the data input/output unit 30.

As shown in FIG. 4, the data input/output unit 30 includes data input/output units 110 of which the number is equal to the number n2 of data input/output terminals DQ. Each of the data input/output units 110 includes a buffer 111 connected to the data input/output terminal DQ, a buffer 112 connected to the bus line BL1, a read FIFO circuit 113 connected between the buffers 111 and 112, and a write FIFO circuit 114 connected between the buffers 111 and 112. With this configuration, during a read operation, read data of n3 bits (=burst length) simultaneously supplied via the bus line BL1 are prefetched to the read FIFO circuit 113, and the read data are serially output from the data input/output terminal DQ. On the other hand, during a write operation, write data of n3 bits (=burst length) serially supplied via the data input/output terminal DQ are prefetched to the write FIFO circuit 114, and the write data are simultaneously output to the bus line BL1.

Figure 5A:
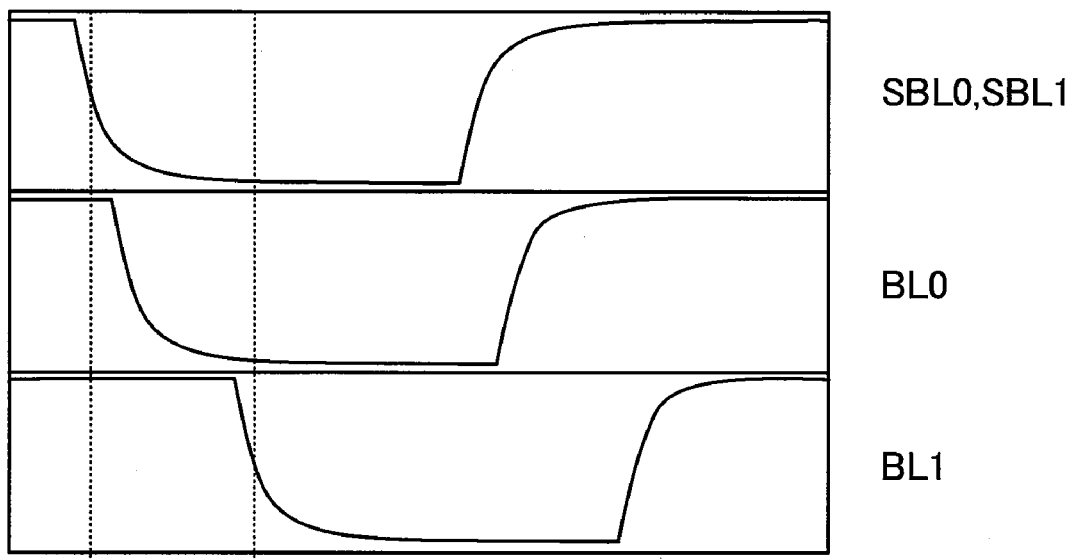
FIGS. 5A and 5B are waveform charts for explaining an effect of the semiconductor device according to the present embodiment.
Figure 5B:
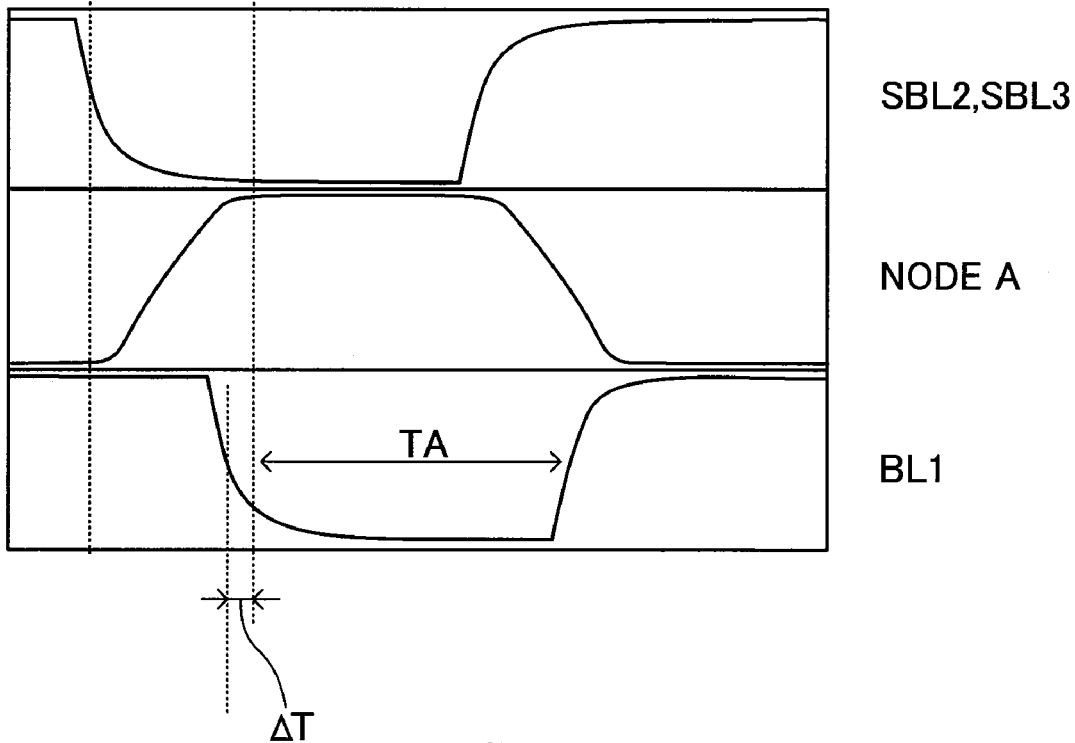

FIGS. 5A and 5B are waveform charts for explaining an effect of the semiconductor device according to the present embodiment.

FIG. 5A is a waveform chart obtained when the read data is read from the banks Bank0 to Bank3, and indicates that waveforms of the read data are delayed in the order of the sub-bus lines SBL0 and SBL1, the bus line BL0, and the bus line BL1. In this case, a phase difference between the sub-bus lines SBL0 and SBL1 and the bus line BL0 results from the transfer delay times T0$a$ of the buffers 40 and 41, and a phase difference between the bus line BL0 and the bus line BL1 results from the transfer delay time T0$b$ of the buffer 50.

Meanwhile, FIG. 5B is a waveform chart obtained when the read data is read from the banks Bank4 to Bank7. A phase of the read data transferred through the sub-bus lines SBL2 and SBL3 matches the phase of the read data transferred through the sub-bus lines SBL0 and SBL1. A waveform of the read data in the bus line BL1 is delayed from the waveform of the read data in the sub-bus lines SBL2 and SBL3. The phase difference is produced by the transfer delay time T1 of the buffers 42 and 43. A node "A" shown in FIG. 5B is one end of the capacitive element 103 shown in FIG. 3.

In the present embodiment, the relationship of T1>T0, preferably T1=T0$a$+T0$b$ is set. Accordingly, a difference $\Delta T$ between the waveform of data on the bus line BL1 shown in FIG. 5A and the waveform of data on the bus line BL1 shown in FIG. 5B is greatly shortened, and ideally, the difference $\Delta T$ becomes zero. Therefore, the read data from all the banks are output at the substantially same timing, and thus a period TA during which the data are available can be sufficiently ensured. The same applies to the write operation.

Figure 7A:
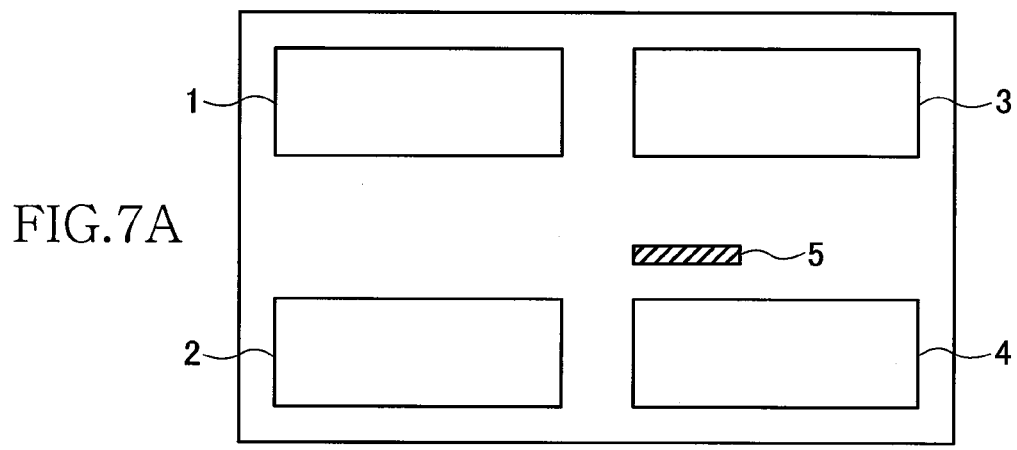
FIGS. 7A to 7C are schematic diagrams of configurations of conventional semiconductor memory devices.
Figure 7B:
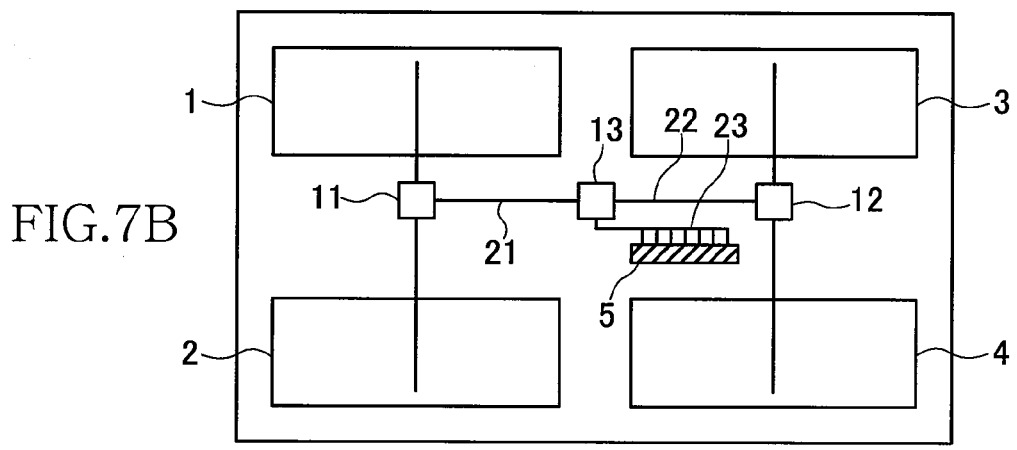
Figure 7C:
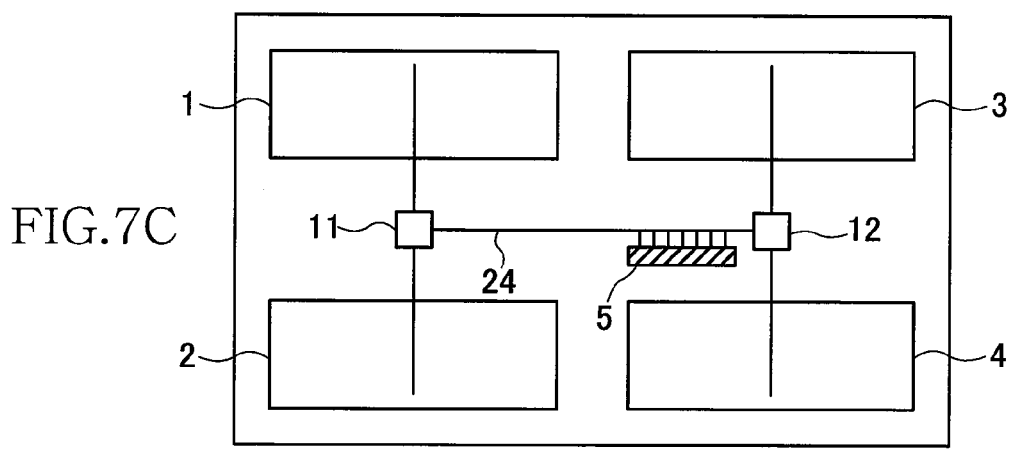

In addition, in the semiconductor device according to the present embodiment, there is no need to detour the bus line as in the example shown in FIG. 7B nor is there a need of sharing the bus line as in the example shown in FIG. 7C. Accordingly, significant increase in wire density or increase in power consumption resulting therefrom does not occur.

It is apparent that the present invention is not limited to the above embodiments, but may be modified and changed without departing from the scope and spirit of the invention.

Figure 6:
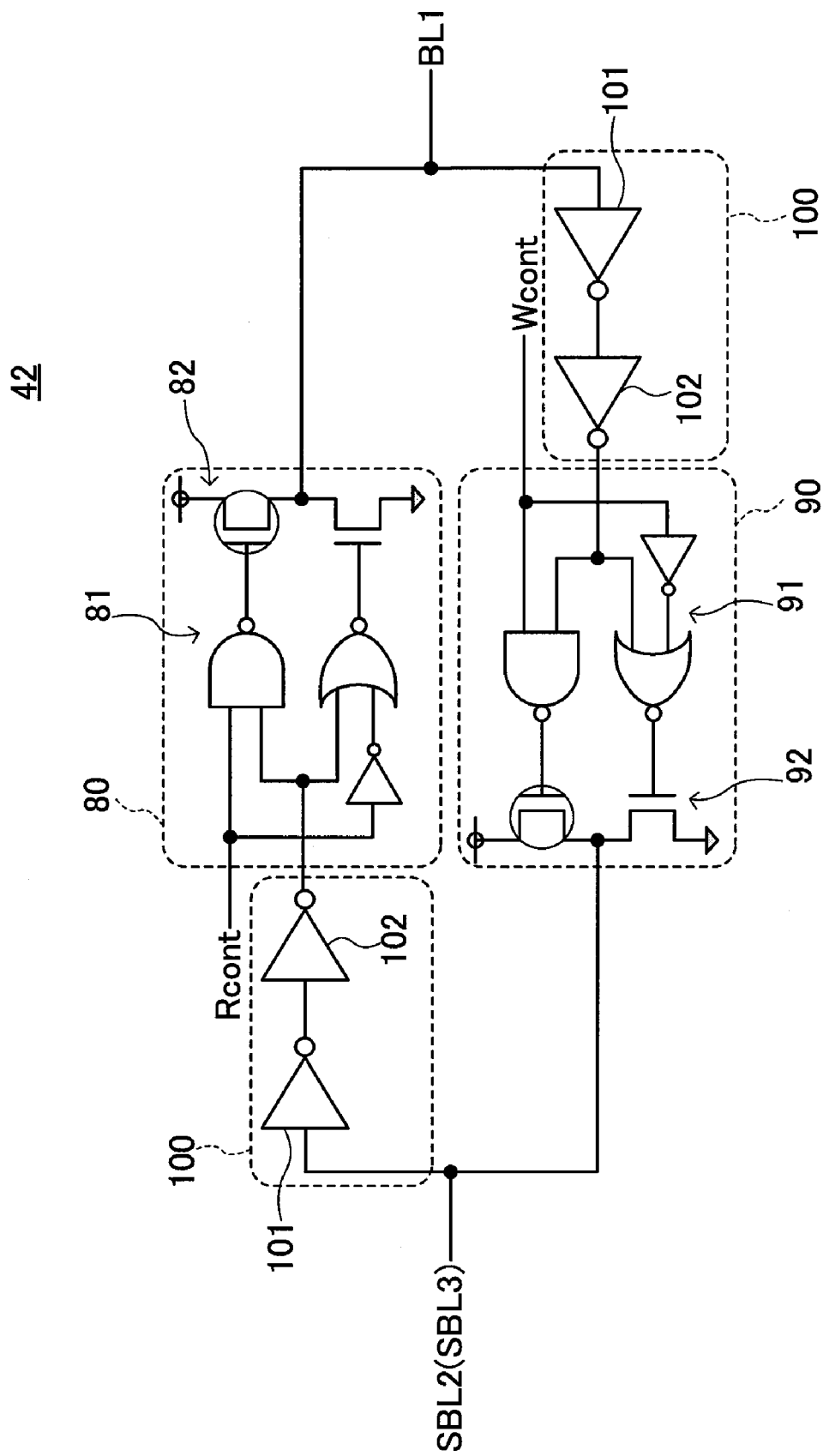
FIG. 6 is a circuit diagram of the buffer 42 according to a modified example.

For example, in the present invention, the circuit configuration of the delay circuit 100 is not limited to that shown in FIG. 3. As long as it is possible to increase the transfer delay time, a different circuit configuration can be adopted. As one example, a circuit configuration shown in FIG. 6 can be adopted. In the delay circuit 100 shown in FIG. 6, instead of deleting the capacitative element 103, a W/L ratio of transistors configuring the inverters 101 and 102 is set to a sufficiently small value, and thereby, a signal propagation time is increased. A specific W/L ratio can be designed according to a required delay amount. In order to secure a significant delay amount, however, it is necessary that the W/L ratio be designed to be smaller than at least the W/L ratio of the transistors configuring the logic circuits 81 and 91. For example, it suffices that the W/L ratio of the transistors configuring the inverters 101 and 102 is set to about ¼ of the W/L ratio of the transistors configuring the logic circuits 81 and 91.

In the present embodiment, the example in which the present invention is applied to a DRAM has been explained. However, targets to which the present invention is applied are not limited thereto and the present invention can be applied to a semiconductor memory other than the DRAM, an SRAM or a PRAM, for example. The present invention can be also applied to a semiconductor device other than the semiconductor memory.

What is claimed is:

1. A semiconductor device comprising:
   first and second bus lines;
   a first buffer connected between the first and second bus lines;
   a second buffer connected to the first bus line on an opposite side from the first buffer;
   a third buffer connected to the second bus line on an opposite side from the first buffer;
   a first internal circuit connected via the second buffer to the first bus line;
   a second internal circuit connected via the third buffer and the first buffer to the first bus line; and
   a data input/output unit connected to the first bus line, wherein
   a transfer delay time of the second buffer is longer than each of transfer delay times of the first and third buffers.

2. The semiconductor device as claimed in claim 1, wherein the first buffer is located between the first and second internal circuits.

3. The semiconductor device as claimed in claim 1, further comprising:
   a first sub-bus line that connects the second buffer and the first internal circuit; and
   a second sub-bus line that connects the third buffer and the second internal circuit, wherein
   wire lengths of the first and second sub-bus lines are substantially equal to each other.

4. The semiconductor device as claimed in claim 1, wherein the transfer delay time of the second buffer is substantially equal to a sum of the transfer delay times of the first and third buffers.

5. The semiconductor device as claimed in claim 1, wherein wire lengths of the first and second bus lines are substantially equal to each other.

6. The semiconductor device as claimed in claim 1, wherein the second buffer includes a delay circuit that delays an input signal.

7. The semiconductor device as claimed in claim 6, wherein the delay circuit includes a plurality of inverters connected in cascade.

8. A semiconductor device comprising:
   first and second internal circuits located along a first direction;
   a first sub-bus line that is connected to the first internal circuit, the first sub-bus line extending to a second direction crossing the first direction;
   a second sub-bus line that is connected to the second internal circuit, the second sub-bus line extending to the second direction;
   a first bus line that extends to the first direction and arranged at a position nearer the first internal circuit than the second internal circuit;
   a second bus line that extends to the first direction and arranged at a position nearer the second internal circuit than the first internal circuit;
   a first buffer that connects the first bus line and the second bus line;
   a second buffer that connects the first bus line and the first sub-bus line;
   a third buffer that connects the second bus line and the second sub-bus line; and
   a data input/output unit connected to the first bus line, wherein
   the second buffer includes a first delay circuit that delays an input signal supplied via the first sub-bus line, and a second delay circuit that delays an input signal supplied via the first bus line.

9. The semiconductor device as claimed in claim 8, wherein
   the second buffer further includes:
   a first tristate buffer that outputs the input signal supplied via the first sub-bus line to the first bus line in response to a first control signal; and
   a second tristate buffer that outputs the input signal supplied via the first bus line to the first sub-bus line in response to a second control signal,
   the first delay circuit is connected at an input node of the first tristate buffer, and
   the second delay circuit is connected at an input node of the second tristate buffer.

10. The semiconductor device as claimed in claim 9, wherein each of the first and second delay circuits includes a plurality of inverters connected in cascade.

11. The semiconductor device as claimed in claim 10, wherein each of the first and second delay circuits further includes capacitive elements connected between the inverters.

12. The semiconductor device as claimed in claim 10, wherein
   the first tristate buffer includes a first output transistor that drives the first bus line and a first logic circuit that controls the first output transistor,
   the second tristate buffer includes a second output transistor that drives the first sub-bus line and a second logic circuit that controls the second output transistor, and
   a W/L ratio of transistors configuring the inverters is smaller than a W/L ratio of transistors configuring the first and second logic circuits.

13. The semiconductor device as claimed in claim 8, wherein wire lengths of the first and second sub-bus lines are substantially equal to each other.

14. The semiconductor device as claimed in claim 8, wherein wire lengths of the first and second bus lines are substantially equal to each other.

* * * * *